US009209763B2

(12) United States Patent
Bottarel et al.

(10) Patent No.: US 9,209,763 B2
(45) Date of Patent: Dec. 8, 2015

(54) CIRCUIT AND METHOD FOR ADJUSTING THE ELECTRIC POWER SUPPLY OF AN ENERGY-SCAVENGING SYSTEM

(71) Applicant: STMicroelectronics S.r.l., Agrate Brianza (IT)

(72) Inventors: Valeria Bottarel, Novara (IT); Giulio Ricotti, Broni (IT); Sandro Rossi, Pavia (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 161 days.

(21) Appl. No.: 14/052,495

(22) Filed: Oct. 11, 2013

(65) Prior Publication Data

US 2014/0104002 A1    Apr. 17, 2014

(30) Foreign Application Priority Data

Oct. 17, 2012  (IT) .............................. TO2012A0919

(51) Int. Cl.
  *H03F 3/45*    (2006.01)
  *H02N 2/18*    (2006.01)
  *H02M 1/00*    (2007.01)

(52) U.S. Cl.
  CPC ........... *H03F 3/45076* (2013.01); *H02N 2/181* (2013.01); *H02M 2001/0006* (2013.01)

(58) Field of Classification Search
  CPC ........................................................ H03F 3/45
  USPC ............................................ 330/261, 69, 260
  See application file for complete search history.

(56) References Cited

U.S. PATENT DOCUMENTS

| | | | | |
|---|---|---|---|---|
| 3,596,109 A * | 7/1971 | Marshall | ........................... | 327/58 |
| 4,628,265 A * | 12/1986 | Johnson et al. | ............... | 324/329 |
| 5,189,571 A * | 2/1993 | Murphy et al. | .................. | 360/75 |
| 5,260,644 A * | 11/1993 | Curtis | ........................... | 323/226 |
| 5,451,949 A * | 9/1995 | Gundry | ........................... | 341/143 |
| 5,650,714 A * | 7/1997 | Otaka et al. | ................... | 323/217 |
| 7,154,923 B2 * | 12/2006 | Kucharski | ................ | 372/29.015 |

OTHER PUBLICATIONS

Italian Search Report and Written Opinion for IT TO2012A000919 mailed Jun. 19, 2013 (8 pages).
Peters, Christian, et al: "A CMOS Integrated Voltage and Power Efficient AC/DC Converter for Energy Harvesting Applications," 2008 IPO Publishing Ltd, Journal of Micromechanics and Microengineering (10 pages).
Kwon, Dongwon, et al: "A 2-μm BiCMOS Rectifier-Free AC-DC Piezoelectric Energy Harvester-Charger IC," IEEE Transactions on Biomedical Circuits and Systems, vol. 4, No. 6, Dec. 2010 (11 pages).
Mateu, Loreto, et al: "Modified Parallel SSHI AC-DC Converter for Piezoelectric Energy Harvesting Power Supplies," Telecommunications Energy Conference (INTELEC), 2011 IEEE 33rd International, Oct. 9, 2011, pp. 1-7.

* cited by examiner

*Primary Examiner* — Henry Choe
(74) *Attorney, Agent, or Firm* — Gardere Wynne Sewell LLP

(57) ABSTRACT

A differentiator generates a time derivative signal from a time-variable signal. A transconductance amplifier generates a biasing control signal as a function of the time derivative signal. A supply network functions to supply the differentiator and transconductance amplifier. The supply network is driven by the biasing control signal output from the transconductance amplifier. With this configuration, speed of operation of the differentiator and transconductance amplifier vary with the supply provided by the supply network, and the supply is modulated as a function of the received time-variable signal.

19 Claims, 11 Drawing Sheets

CIRCUIT AND METHOD FOR ADJUSTING THE ELECTRIC POWER SUPPLY OF AN ENERGY-SCAVENGING SYSTEM

PRIORITY CLAIM

This application claims priority from Italian Application for Patent No. TO2012A000919 filed Oct. 17, 2012, the disclosure of which is incorporated by reference.

TECHNICAL FIELD

The present invention relates to a circuit and a method for adjusting electric power supply for an energy-scavenging system. In particular, the electric power supply is varied on the basis of the characteristics of the signal at input to, and transduced by, the energy-scavenging system. The circuit can also be used for supplying selective portions of the environmental-energy-scavenging system or of the adjustment system itself.

BACKGROUND

As is known, systems for energy scavenging or energy harvesting from intermittent environmental energy sources (which supply, that is, energy in an irregular way) have aroused and continue to arouse considerable interest in a wide range of fields of technology. Typically, energy-scavenging systems are configured to harvest, store, and transfer energy generated by mechanical sources to a generic load of an electrical type.

Low-frequency vibrations, such as, for example, mechanical vibrations of disturbance in systems with moving parts, may be a valid source of energy. The mechanical energy is converted, by one or more purposely provided transducers (for example, piezoelectric or electromagnetic devices) into electrical energy, which can be used for supplying an electrical load. In this way, the electrical load does not require batteries or other supply systems that are cumbersome and present a poor resistance to mechanical stresses.

FIG. 1 is a schematic illustration of an energy-scavenging circuit 1 according to an embodiment of a known type. The energy-scavenging circuit 1 comprises a transducer 2, for example of a piezoresistive type, subjected to environmental stresses (signal $S_E$), which generates a time-variable voltage signal $V_{TRANSD}$. The energy-scavenging circuit 1 includes an energy storage circuit 4, for example a capacitor, configured to store the electrical energy transduced. The transducer 2 and the storage element 4 are coupled together by means of a diode 5. In use, the voltage $V_{TRANSD}$ (which, in general, does not necessarily has a sinusoidal waveform, but has a substantially random evolution) is received at input by the diode 5 which operates as peak detector. With reference to FIGS. 2a and 2b, the detection of a peak P1 of $V_{TRANSD}$ (above the conduction threshold of the diode 5) causes the transfer to the storage element 4 of a current $I_{CHARGE}$ that charges the storage element 4, saturating it. Any possible peaks P2, P3 of $V_{TRANSD}$ that have an amplitude smaller than the peak P1, and that follow the peak P1 do not concur in charging the storage element 4.

The above behavior of the energy-scavenging circuit 1 is not desirable.

There is a need in the art to provide a circuit and a method for adjusting the electric power supply for an environmental-energy-scavenging system that will be free from the drawbacks of the known art.

SUMMARY

According to an embodiment, a circuit comprises: a differentiator configured to receive a first electrical signal which is a time-variable signal and supply a second electrical signal that is a time derivative of said first electrical signal; and a transconductance amplifier configured to receive the second electrical signal and generate a third electrical signal that is a function of the second electrical signal and is amplified with respect to the second electrical signal.

In accordance with an embodiment, a method comprises: acquiring a first electrical signal which is a time-variable signal; generating by a differentiator of a second electrical signal that is the time derivative of said first electrical signal; and generating by a transconductance amplifier of a third electrical signal that is a function of the second electrical signal and is amplified with respect to the second electrical signal.

In accordance with an embodiment, a circuit comprises: a peak detection circuit configured to detect a peak voltage of a received time-varying voltage signal, said peak detection circuit comprising: a differentiator circuit coupled to receive the time-varying voltage signal and generate a derivative voltage signal; a biasing circuit configured to bias operation of the differentiator circuit with a bias supply, said differentiator circuit having a speed of operation dependent on said bias supply; a transconductance circuit configured to process the derivative voltage signal and generate a bias control signal that is dependent on the derivative voltage signal, said bias control signal applied to the biasing circuit to control the bias supply.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION OF THE DRAWINGS

Figure 3:
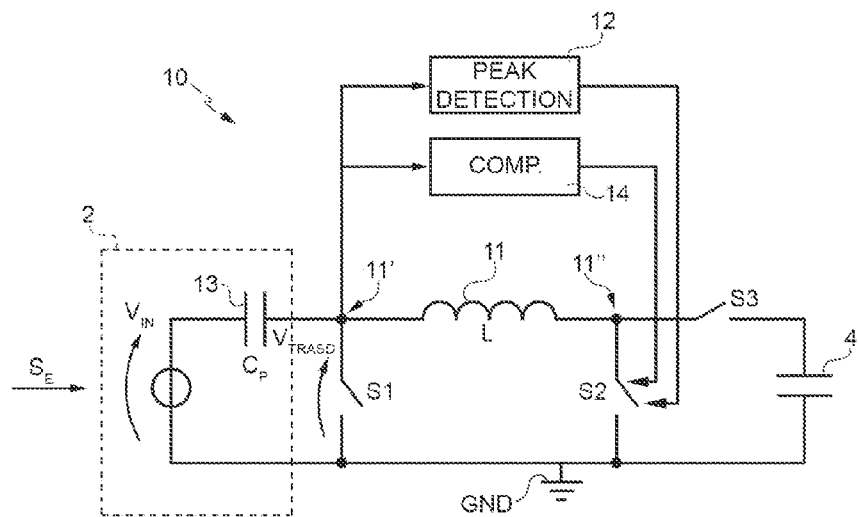
FIG. 3 shows an environmental-energy-scavenging system alternative to the system of FIG. 1.

The energy-scavenging circuit 10 of FIG. 3 comprises a transducer 2 (in this case similar to the transducer 2 of FIG. 1 and hence identified by the same reference number) based upon a piezoelectric, and represented by means of a voltage generator 2a in series with a capacitor 13. The voltage generator 2a generates a voltage $V_{IN}$ on the basis of the environmental mechanical/vibrational energy $S_E$ to which it is subjected. The capacitor 13 represents the output capacitance of the equivalent circuit of a piezoelectric in cantilever configuration that vibrates at the resonance frequency. The energy-scavenging circuit 10 further comprises an inductor 11 having a first terminal 11' coupled to the capacitor 13 and a second terminal 11" coupled to the storage element 4. The energy-scavenging circuit 10 further comprises a peak detector 12 and a comparator 14, which are configured to receive at input the transduced voltage $V_{TRANSD}$ generated by the transducer 2 and operate as described with reference to FIG. 4 for detecting, respectively, a peak of the voltage $V_{TRANSD}$ and reaching of a reference value of the voltage $V_{TRANSD}$. The comparator 14 compares the transduced voltage $V_{TRANSD}$ with a ground reference signal GND and supplies at output a signal indicating the end of the transfer of energy from the transducer 2 to the storage element 4.

The energy-scavenging circuit 10 further comprises: a plurality of controlled switches (e.g., transistors), and in particular a switch $S_1$ coupled between the first conduction terminal 11' of the inductor 11 and a terminal at reference voltage GND (ground voltage, for example 0 V); a switch $S_2$, coupled between the second conduction terminal 11" of the inductor 11 and the terminal at reference voltage GND; and a switch $S_3$, arranged between the second conduction terminal 11" of the inductor 11 and the storage element 4, for coupling the inductor 11 to and decoupling it from the storage element 4. According to an alternative embodiment, the switches $S_1$ and $S_3$ are replaced by diodes. According to a different embodiment, the switches are controlled switches, for example MOSFETs. According to a further embodiment, the switches $S_1$ and $S_3$ are transistors in diode configuration.

It should be noted that, in accordance with the present description, by "switch open" or "inhibited" is meant a switch that does not conduct electric current; instead, by "switch closed" is meant a switch that conducts electric current. Moreover, the following description of FIG. 4 refers to active control of the switches $S_1$ and $S_3$. However, it is evident that, in the case where the latter are replaced by diodes, the operations of "opening" and "closing" of the switches $S_1$ and $S_3$ correspond to conditions in which the diodes that form the switches $S_1$ and $S_3$ are inhibited and, respectively, conduct, according to the normal operating phases of the diodes.

Figure 4:
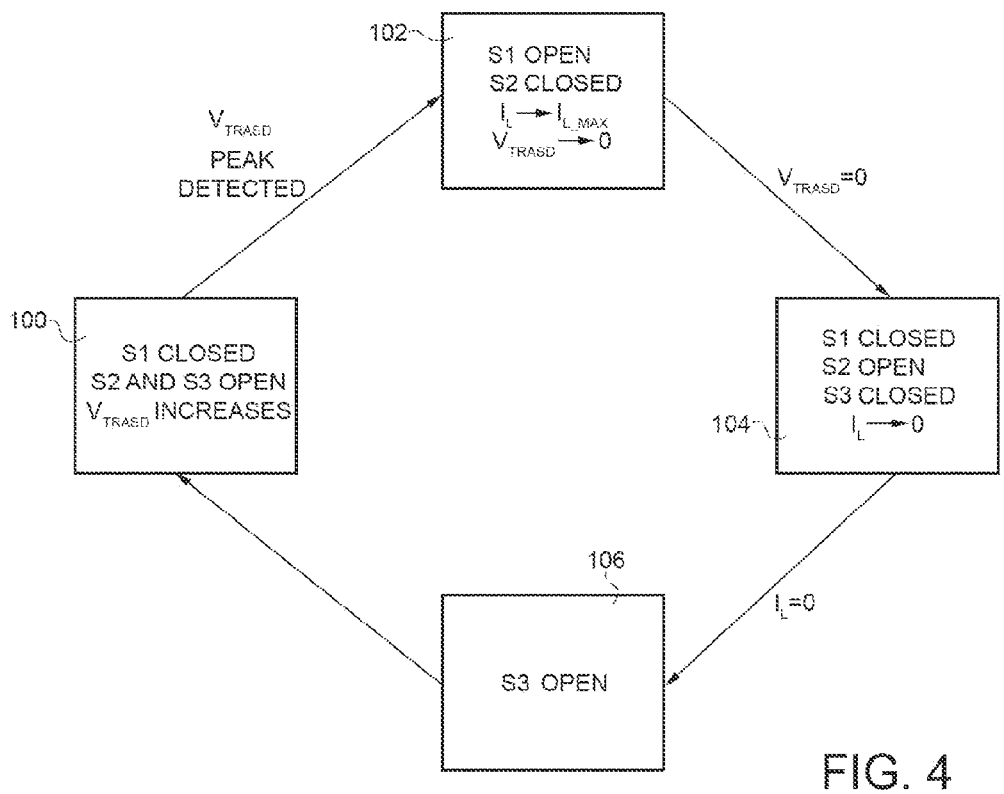
FIG. 4 shows steps of operation of the environmental-energy-scavenging system of FIG. 3.

With reference to FIG. 4, in use, during an initial operating condition (step 100), the switches $S_2$ and $S_3$ are open, and the switch $S_1$ is closed. The output capacitor 13 of the piezoelectric is charged by the signal $V_{IN}$ generated by the transducer 2 in response to the external signal $S_E$ (precharging phase).

The voltage at output from the transducer 2 is the voltage $V_{IN}$ and follows the input signal $S_E$. The charge of the precharging capacitor 13 follows the evolution of $V_{IN}$, and in particular for positive half-waves of $V_{IN}$, the charge stored on the precharging capacitor 13 increases. The energy stored in the precharging capacitor is described by the relation $\frac{1}{2}C_p V_{IN}^2$, where $C_p$ is the capacitance of the precharging capacitor 13.

The peak detector 12 receives at input the voltage $V_{TRANSD}$, present on the first terminal 11' of the inductor 11 (downstream of the precharging capacitor 13), and is able to detect the presence of a voltage peak of said voltage signal. Upon detection of the peak (which causes transition between step 100 and step 102), the switch $S_1$ is opened and the switch $S_2$ is closed (step 102). The energy stored in the precharging capacitor 13 is transferred on the inductor 11, according to the relation $\frac{1}{2}L I_L^2$, where L is the value of inductance of the inductor 11 and $I_L$ is the current in the inductor 11. The current $I_L$ in the inductor 11 increases rapidly until it reaches a maximum value $I_{L\_MAX}$. At the same time, the voltage $V_{TRANSD}$ drops to zero. The comparator 14 monitors the voltage $V_{TRANSD}$ and, when it detects the condition $V_{TRANSD}=0$, drives the switch $S_2$ into an open condition (step 104). The switch $S_3$ is driven in conduction following upon opening of the switch $S_2$. With the switch $S_3$ closed, the current stored in the inductor 11 drops from the maximum value to the zero value, charging the storage element 4.

When the current $I_L$ that traverses the inductor 11 reaches an approximately zero value (all the current has been transferred), the switch $S_3$ is inhibited (step 106). Then, the steps 100-106 of charging and discharging repeat.

Transfer of energy from the precharging capacitor 13 to the inductor 11 is preferably fast in order to maximize the efficiency of recovery of energy by the piezoelectric transducer, and in particular must take place as soon as the peak detector 12 signals the presence of the desired peak. In particular, the peak detector 12 can function in low-consumption and low-reactivity mode as long as it is in a step of waiting for the peak (monitoring of the voltage $V_{TRANSD}$), whereas it is preferable for the comparator to function at high speed following upon detection of the peak. Similar considerations apply in general for the blocks that affect the passage of the energy-scavenging circuit 10 from one state to the next. With reference to the comparator 14, for example, it is important for detection of zero-crossing of the signal that it receives at input to be made rapidly, and that for it to drive the switch $S_2$ into an open state as soon as said detection has been carried out so as to prevent effects of return of the current stored in the inductor 11 towards the transducer 2. Said operations can be carried out at a high speed if the current that supplies the comparator 14 is high. However, a compromise must be found with the need to guarantee a low consumption.

In addition, the energy-scavenging circuit 10 is not suited to operating with input signals at high frequency, in so far as the supply signals (in the region of some tens of nanoamps, e.g., 30 nA) guarantee low consumption but do not enable high speed of operation of the peak detector and/or of the comparator, which, instead, are necessary for operating on high-frequency signals.

As has been said, the electrical energy supplied by the transducer (in the form of voltage $V_{TRANSD}$), depends upon the characteristics of the environmental energy source that acts on the transducer. The environmental source is, typically, not predictable in amplitude and/or frequency. Since the frequency of the environmental signal $S_E$ (and of the transduced signal $V_{TRANSD}$) is variable, the power-supply adjustment circuit adapts to the detected slope of the transduced signal $V_{TRANSD}$, and enables supply of an energy-scavenging system, or selective portions thereof, with high energy only when the input signal has a high frequency. In other words, the supply adapts to the characteristics of the transduced signal $V_{TRANSD}$ and, consequently, of the environmental signal $S_E$. According to a further aspect, detection of the slope of the transduced signal $V_{TRANSD}$ moreover enables information to be obtained on the presence of a possible peak of the signal, without constraints of minimum amplitude of said peak. Hence, according to one aspect, the power-supply adjustment circuit integrates some important functions for an environmental-energy-scavenging system, such as for example the peak detector.

Figure 5:
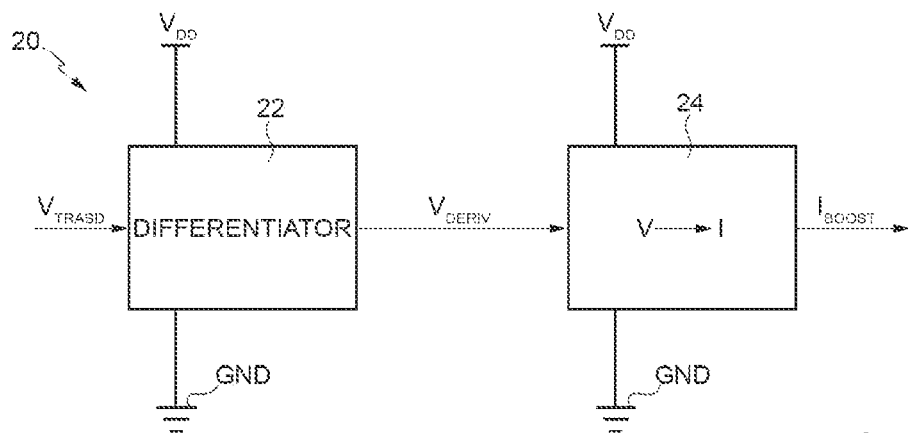
FIG. 5 shows a power-supply adjustment circuit for an environmental-energy-scavenging system.

FIG. 5 is a schematic illustration, by means of functional blocks, of an adjustment circuit 20.

Figure 6:
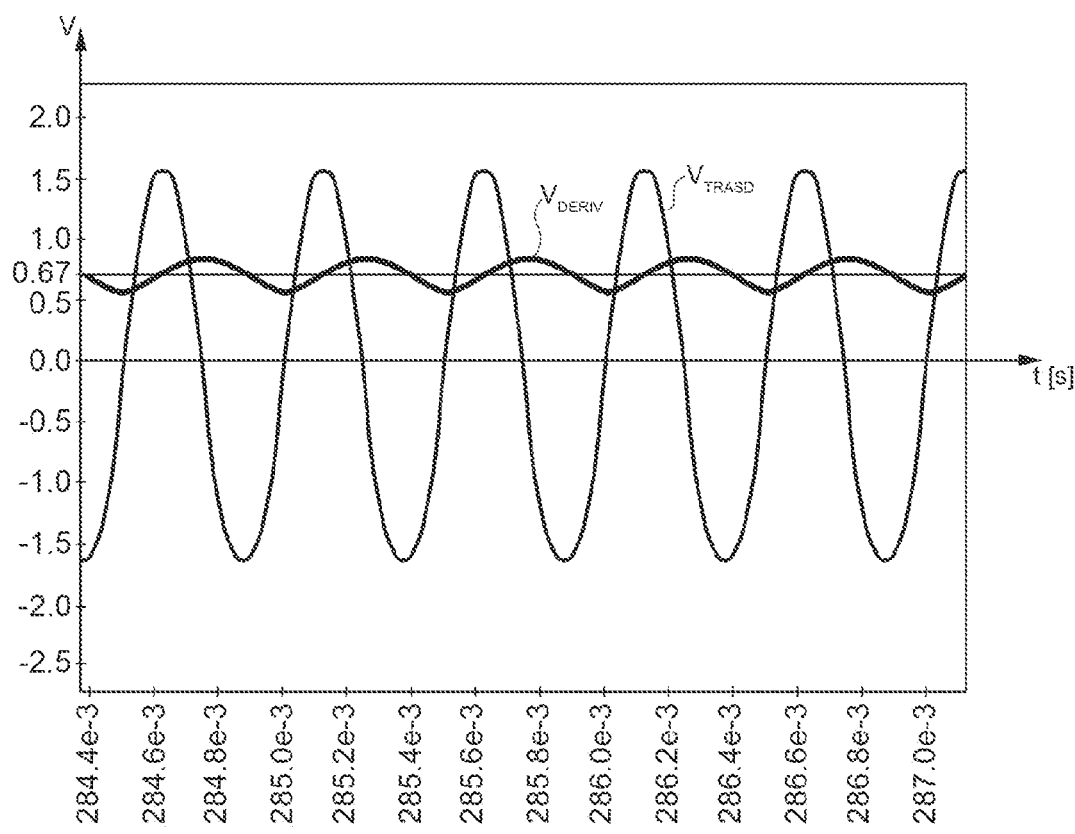
FIG. 6 shows signals generated by the adjustment circuit of FIG. 5, in use.

The adjustment circuit 20 comprises a differentiator 22, which receives at input the transduced voltage signal $V_{TRANSD}$, and generates at output a voltage signal $V_{DERIV}$ that is the derivative of the transduced voltage signal $V_{TRANSD}$. The differentiator 22 operates in a way in itself known. FIG. 6 shows, by way of example, the transduced voltage signal $V_{TRANSD}$ (at input to the differentiator) superimposed on the voltage signal $V_{DERIV}$ (at output from the differentiator). In this particular case, where the input $V_{TRANSD}$ is a sinusoidal signal, the voltage signal $V_{DERIV}$ at output is a cosinusoidal signal, i.e., phase-shifted by 90° with respect to the transduced voltage signal $V_{TRANSD}$. The voltage signal $V_{DERIV}$ is centered on a value of 670 mV. As described hereinafter, this value is provided purely by way of example of a possible circuit implementation, and represents the DC working point of the differentiator 22.

The adjustment circuit 20 further comprises a transconductance amplifier 24, coupled to the output of the differentiator 22 and configured for receiving at input the voltage signal $V_{DERIV}$ and generating at output a current signal $I_{BOOST}$ the value of which depends upon the value of the voltage signal $V_{DERIV}$. The transconductance amplifier 24 preferably has a linear transconductance, and $I_{BOOST}$ is proportional to $V_{DERIV}$.

As is known, the higher the frequency of the transduced voltage signal $V_{TRANSD}$, the higher the voltage value of the signal $V_{DERIV}$. Hence, supplying the voltage signal $V_{DERIV}$ at input to the transconductance amplifier 24, the signal $I_{BOOST}$ will have a value (in current) that increases and decreases together with a corresponding increase/decrease of the value (in voltage) of the signal $V_{DERIV}$.

The current $I_{BOOST}$ thus obtained can be advantageously used for supplying selectively portions of the adjustment circuit 20 when (and only when) the input signal or the transduced signal $V_{TRANSD}$ has a high frequency. In this way, for portions of the transduced signal $V_{TRANSD}$ that have a low frequency, the adjustment circuit 20 can function with reduced consumption levels and at a low speed. Instead, for portions of the transduced signal $V_{TRANSD}$ that have a high frequency, the adjustment circuit 20 can function with increased consumption levels and at a high speed to follow the variations of the signal $V_{TRANSD}$.

According to one embodiment, the adjustment circuit 20 can be coupled to the energy-scavenging circuit of the type shown in FIG. 3. In this case, the differentiator 22 can be used for replacing the peak detector 12 (the derivative of the signal $V_{TRANSD}$ enables in fact information to be obtained on the fact that a peak has been reached, when it assumes an approximately zero value). Moreover, the current $I_{BOOST}$ can be used for providing an additional power supply to the comparator 14, and to the differentiator 22 itself, enabling the comparator 14 and the differentiator 22 to adapt the consumption levels and the speed of operation to the frequency of the transduced signal $V_{TRANSD}$.

Figure 7:
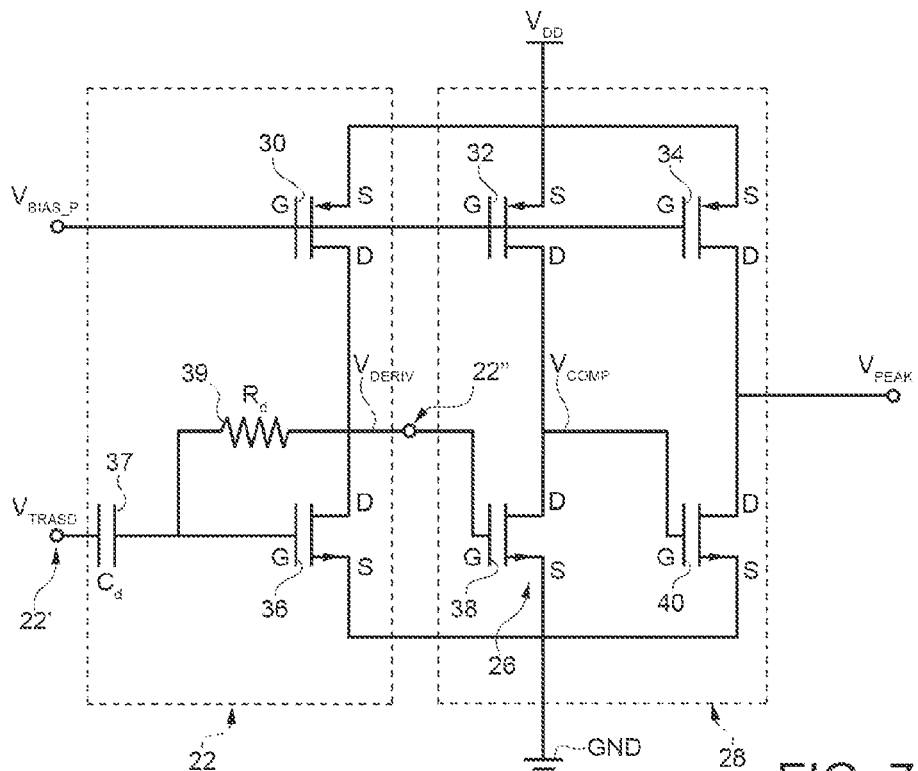
FIG. 7 shows a circuit implementation of a differentiator, a comparator, and a peak detector belonging to the adjustment circuit of FIG. 5.

FIG. 7 shows, according to an embodiment of the present invention, a circuit implementation of a differentiator 22 and of a peak detector 28 operatively coupled together. The peak detector 28 includes a comparator 26 that constitutes an input stage of the peak detector 28. The comparator 26 compares the derivative signal generated by the differentiator 22 (which oscillates around 670 mV according to the example described) with a DC signal fixed to the value of 670 mV, and generates at output a signal that saturates at "low" (or "0") and "high" (or "1") logic values yielding a digital indication of the fact that the derivative signal is higher or lower than the threshold of 670 mV (the transition corresponds to the peak of the signal).

Each of the differentiator 22 and the peak detector 28 is supplied by a power supply network of its own, which receives a supply voltage $V_{DD}$ external to the adjustment circuit 20, for example supplied by a battery (not shown) coupled to the energy-scavenging circuit.

The power supply network of the differentiator 22 and of the peak detector 28 is represented in FIG. 7 by means of supply transistors 30, 32 and 34 of a PMOS type, which have the respective source terminal S coupled to the supply voltage $V_{DD}$ (for example, having a value of approximately 5 V), and the respective control terminal (or gate terminal) G biased at one and the same biasing voltage $V_{BIAS\_P}$, for example of a value comprised between approximately 600 and 700 mV. In any case, the biasing voltage $V_{BIAS\_P}$ is chosen of a value such as to generate a current through the respective transistor of some tens of nanoamps (in order to limit as much as possible the consumption levels), for example approximately 30 nA (it is hence clear that the value of biasing voltage $V_{BIAS\_P}$ varies according to the technology and the components chosen; in the case of the example we have $V_{GS\_P}=V_{DD}-V_{BIAS\_P}=660$ mV).

It is evident that the supply transistors 30, 32, 36 may be of a type different from the one described and represented, and may for example be of voltage classes chosen according to the need and availability, for instance, 3.3 V, or 1.8 V.

The differentiator 22 comprises an NMOS transistor 36 having its drain terminal D coupled to a drain terminal D of the supply transistor 30, its source terminal S coupled to reference voltage GND (for example, approximately 0 V), and its control (or gate) terminal G coupled to an input 22' of the differentiator 22 by means of a capacitor 37.

The capacitor 37 has, for example, a capacitance $C_d$ of a value comprised between some picofarads and some tens of nanofarads.

According to one embodiment, the capacitor $C_d$ is external to the chip that houses the differentiator 22 in such a way that it is easily replaceable so as to modulate the working point according to the need.

The input terminal 22' of the differentiator 22 receives the transduced voltage signal $V_{TRANSD}$. A resistor 39, having a resistance $R_d$ of a value, for example, comprised between some hundreds of kiloohms and some megaohms, is coupled between the control terminal G of the NMOS transistor 36 and an output terminal 22" of the differentiator 22. It is pointed out that the values of $R_d$ and $C_d$ are preferably chosen according to the range of frequencies of the signal $V_{TRANSD}$ supplied at input (in the case described there is assumed a range of frequencies between 200 Hz and 200 kHz). For example, in this case, it is possible to choose values $R_d=1$ mΩ and $C_d=2$ pF.

Present on the output terminal 22" is the derivative signal $V_{DERIV}$, which represents the derivative of the transduced signal $V_{TRANSD}$. The derivative signal $V_{DERIV}$ is supplied at input to the comparator 26, as illustrated in what follows.

The comparator 26 comprises an NMOS transistor 38 having its drain terminal D coupled to a drain terminal D of the supply transistor 32, its source terminal S coupled to the reference voltage GND, and its control (or gate) terminal G coupled to the output terminal 22" of the differentiator 22. In this way, the NMOS transistor 38 is controlled in an open and closed state by the voltage signal $V_{DERIV}$.

The comparator 26 generates at output a comparison signal $V_{COMP}$. The comparison signal $V_{COMP}$ is picked up on the drain terminal D of the NMOS transistor 38, and is supplied at input to the peak detector 28. The peak detector 28 is, from a circuit standpoint, similar to the comparator 26, and comprises an NMOS transistor 40 having its drain terminal D coupled to a drain terminal D of the supply transistor 34, its source terminal S coupled to the reference voltage GND, and its control (or gate) terminal G that forms the input of the peak detector 28. The signal $V_{COMP}$ is hence used for biasing the control terminal G of the NMOS transistor 40, controlling the latter in an open and closed state. The peak-detection signal $V_{PEAK}$ generated at output from the peak detector 28 is picked up on the drain terminal D of the transistor 40.

Figure 8:
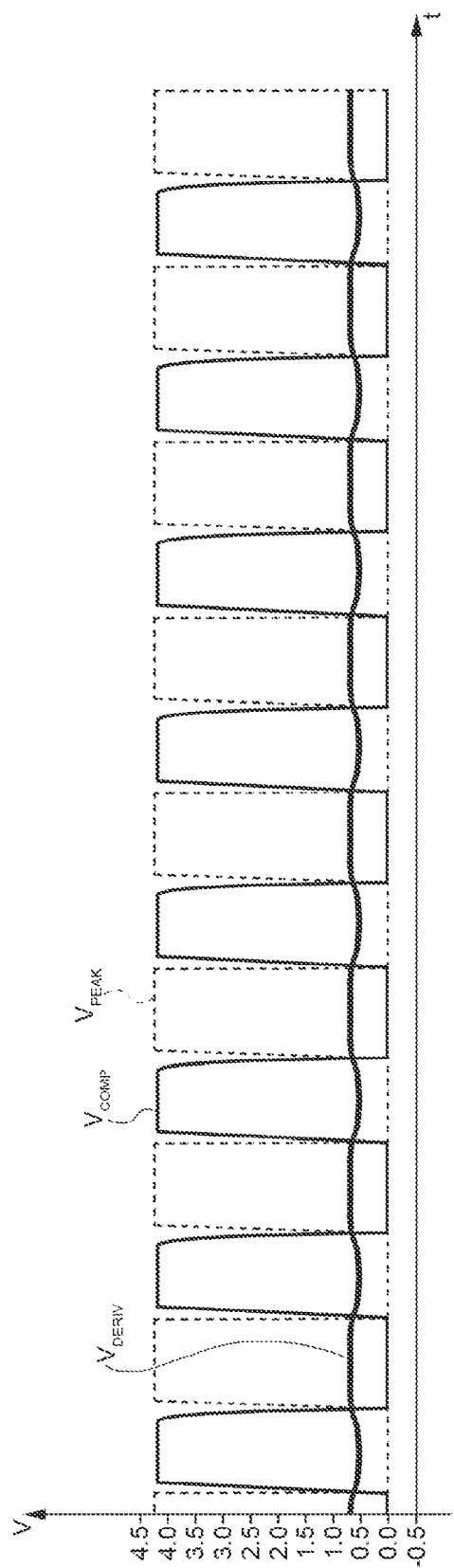
FIG. 8 shows signals generated, in use, by the differentiator, the comparator, and the peak detector of FIG. 7.

The time plot of the voltage signals $V_{DERIV}$, $V_{COMP}$ and $V_{PEAK}$ is shown by way of example in FIG. 8, for a value of frequency of the signal $V_{TRANSD}$ (not shown in FIG. 8) fixed at 800 Hz. Also in this case an ideally sinusoidal signal $V_{TRANSD}$ is assumed.

As may be noted, the signal $V_{DERIV}$ has a substantially sinusoidal waveform and is, in this example, centered on a value of 670 mV (in a way similar to FIG. 6). The value of 670 mV is the DC working point of the transistor 36 of the differentiator 22. The signal $V_{COMP}$ has a waveform of a squarewave type and assumes a minimum value of approximately 0 mV at half-waves of the signal $V_{DERIV}$ below 670 mV, and a maximum value of approximately 4.2 mV at half-waves of the signal $V_{DERIV}$ above 670 mV (also in this case the value of 670 mV is the DC working point of the transistor 38 of the comparator 26). The minimum and maximum values are values of saturation of the comparator 26 and are purely provided by way of example of an embodiment that in no way limits the scope of the present invention.

Transition of the signal $V_{COMP}$ from a minimum value to a maximum value, and vice versa, occurs substantially upon passage of the signal $V_{DERIV}$ through the threshold of 670 mV.

The reason why the voltage signal $V_{DERIV}$ is centered around the value of 670 mV is that this signal drives the control terminal G of the NMOS transistor 38 (owing to the presence of the supply transistor 32), and consequently the voltage on the control terminal G of the transistor 38, in the presence of the derivative signal $V_{DERIV}$, assumes values oscillating around the voltage of turning-on/turning-off of the NMOS transistor 38. It is hence evident that the choice of 670 mV is arbitrary, and depends upon the particular case considered. Other values may be chosen, according to the need. The comparator 26 has hence the function of generating a signal indicating whether the voltage signal $V_{DERIV}$ is above or below the threshold.

Finally, the voltage signal $V_{COMP}$ drives the NMOS transistor 40 of the peak detector 28, and the peak signal $V_{PEAK}$ generated by the latter has a more squared waveform than the signal $V_{COMP}$ (with steeper rising and falling edges). The peak signal $V_{PEAK}$ is phase-shifted by approximately 90° with respect to the signal $V_{COMP}$ (namely, it is in phase with the voltage signal $V_{DERIV}$).

Figure 9:
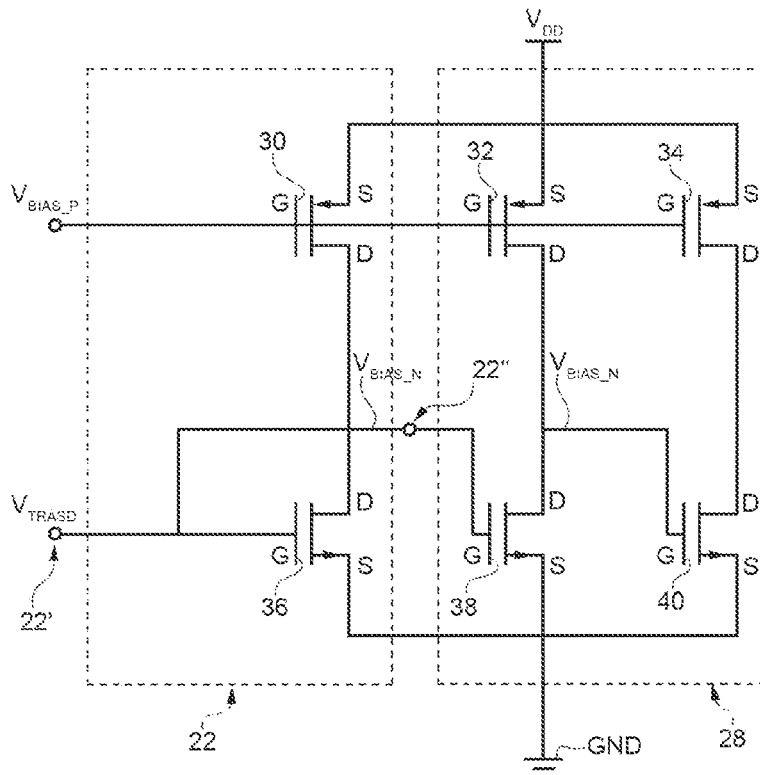
FIG. 9 shows the circuit of FIG. 7 according to an equivalent representation in DC.

FIG. 9 shows the equivalent circuit of the differentiator 22, the comparator 26, and the peak detector 28 of FIG. 7 in the absence of the signal $V_{TRANSD}$ at input to the differentiator 22. The only signal that circulates in the differentiator 22, in the comparator 26, and in the peak detector 28 is hence a DC signal due to biasing of the supply transistors by means of $V_{BIAS\_P}$ and to the presence of the supply $V_{DD}$.

In this case, the supply transistors 30, 32, 34 are driven into an on state by means of the biasing signal $V_{BIAS\_P}$, in a way similar to the situation of FIG. 7. However, since we are in a condition of absence of the signal $V_{TRANSD}$ on the input terminal 22' of the differentiator 22, and the signal that biases the control terminals G of the NMOS transistors 36, 38, 40 is a DC signal, in FIG. 9 designated by the reference $V_{BIAS\_N}$, the effects of the capacitance $C_d$ and of the resistance $R_d$ are not considered. All the NMOS transistors 36, 38 and 40 develop the same gate-to-source voltage $V_{GS}$, which, in the example considered, is approximately 670 mV. As a confirmation of what has already been said, this is the reason why the signal $V_{DERIV}$ of FIG. 8 is centered around the value 670 mV.

Figure 10:
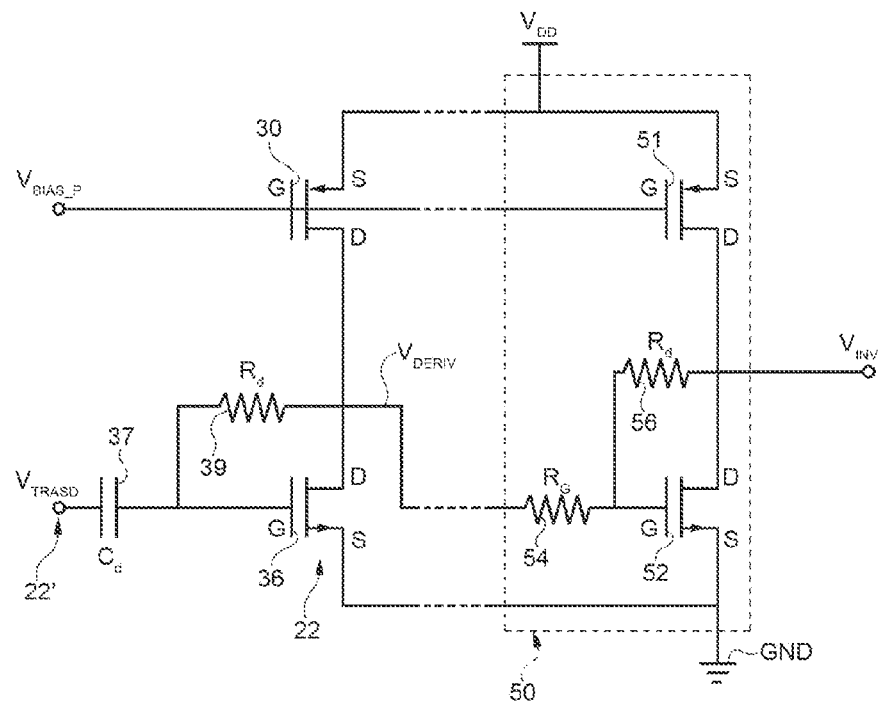
FIG. 10 shows a circuit implementation of an inverting buffer belonging to the adjustment circuit of FIG. 5.

FIG. 10 shows a circuit diagram of an inverting buffer 50, configured to couple the differentiator 22 to the transconductance amplifier 24. The inverting buffer 50 has the function of inverting the derivative signal $V_{DERIV}$, which, as has already been said, is phase-shifted by 90° with respect to the transduced signal $V_{TRANSD}$. The inverting buffer comprises a supply transistor 51, of a PMOS type in analogy to the supply transistors 30, 32, 34, and an NMOS transistor 52 having its drain terminal D coupled to a drain terminal D of the supply transistor 51, its source terminal S coupled to the reference voltage GND, and its control (or gate) terminal G coupled to the output terminal 22" of the differentiator 22 via a resistor 54 having resistance $R_G$. Using the inverting stage 50 as buffer, the resistance $R_G$ has the same value as the resistance $R_d$ of the differentiator 22. Otherwise, the proportion depends upon the gain/attenuation that it is desired to obtain for the inverted signal with respect to the signal $V_{DERIV}$. Moreover, the control terminal G and the drain terminal D of the NMOS transistor 52 are electrically coupled together by means of a resistor 56 having a value of resistance $R_d$ (i.e., equal to the value of resistance of the resistor 39). It is evident that FIG. 10 is a circuit implementation of an inverter, and other implementations are possible. The inverted signal $V_{INV}$ generated at output from the inverting buffer 50 is a voltage signal picked up on the drain terminal D of the NMOS transistor 52. In the case where the value of resistance $R_G$ of the resistor 54 is equal to the value of resistance $R_d$ of the resistor 56, the gain of the inverting buffer is equal to −1. In the case where it is desired to obtain a non-unit gain of the inverted signal $V_{INV}$ with respect to the signal $V_{DERIV}$ it is possible to modulate the value of resistance $R_G$ appropriately, in such a way that $R_G > R_d$. In the case of absence of signal $V_{TRANSD}$ on the input 22' of the differentiator 22 (in a way similar to the situation of FIG. 9), also the NMOS transistor 52 is biased at the same voltage $V_{GS}$ as the transistor 36, and the control terminal G of the transistor 52 is biased by means of a signal $V_{BIAS\_N}'$ equal to $V_{BIAS\_N}$. In this way, in DC conditions there is no current on the resistor 54. DC biasing of the transistor 52 is guaranteed by the supply transistor 51, which is biased with $V_{BIAS\_P}$ like the transistor 30. The NMOS transistor 52, like the transistor 36, in DC conditions is a closed NMOS in transdiode configuration, the $V_{GS}$ of which reaches the value necessary for carrying the biasing current imposed by the supply transistors. For example, in the case described, $V_{BIAS\_N}$=580 mV and $V_{BIAS\_P}$=660 mV.

Figure 11:
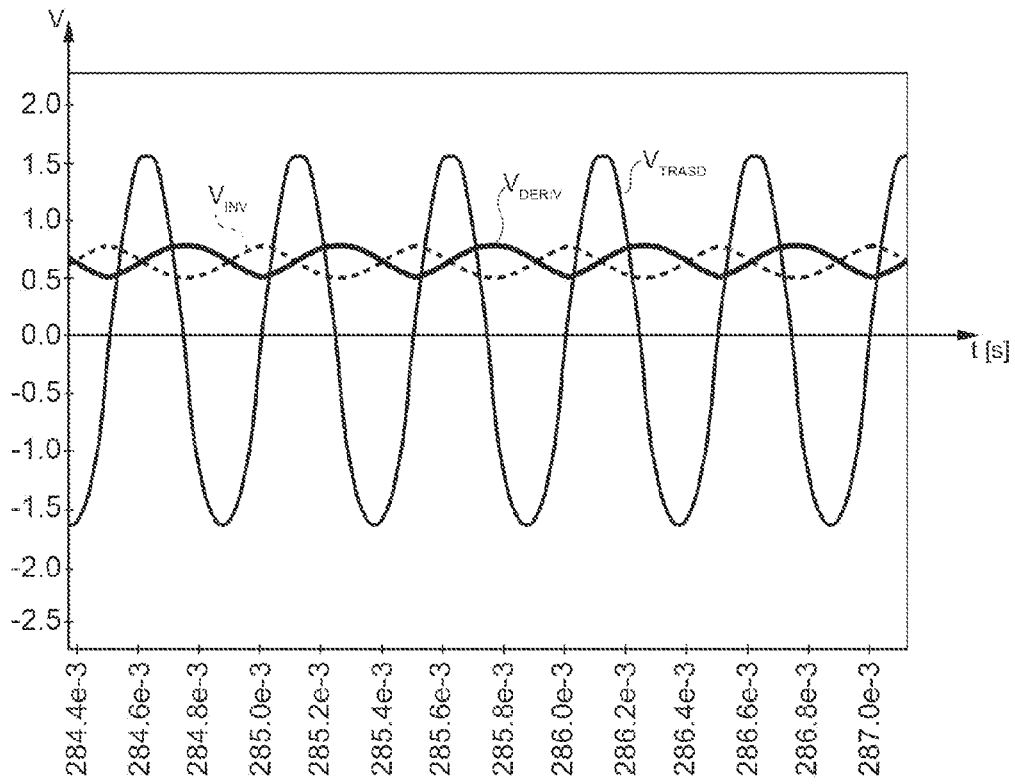
FIG. 11 shows signals generated, in use, by the differentiator and by the inverting buffer of FIG. 10.

FIG. 11 shows the inverted signal $V_{INV}$ superimposed on the derivative signal $V_{DERIV}$ and on the transduced signal $V_{TRANSD}$.

Figure 12:
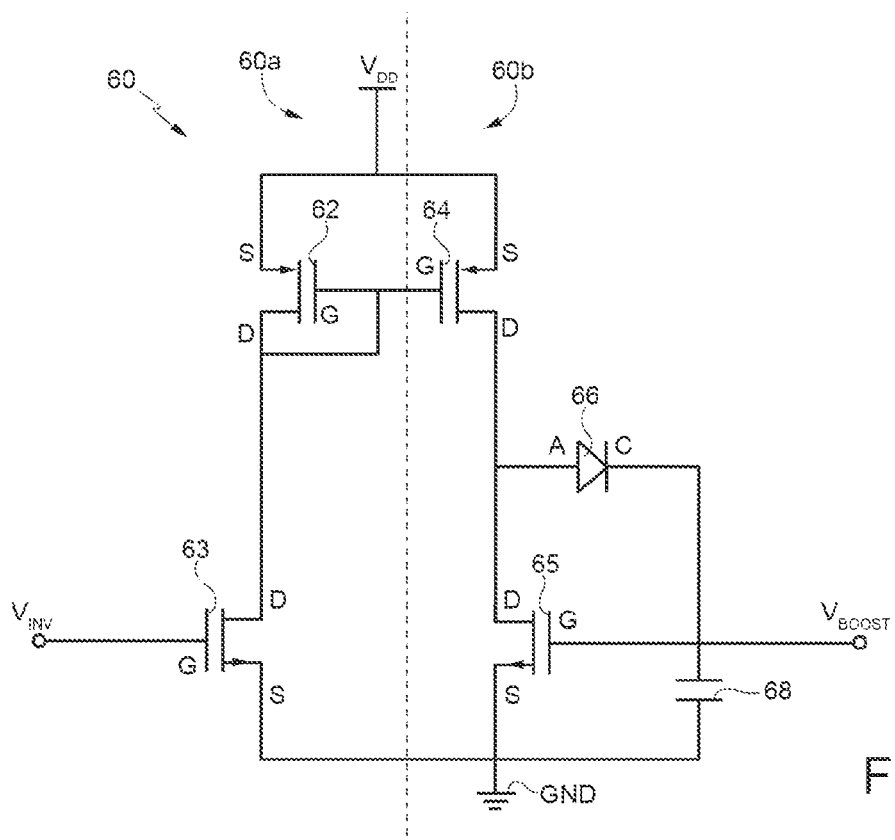
FIG. 12 shows a circuit implementation of a superdiode belonging to the adjustment circuit of FIG. 5.

FIG. 12 shows a superdiode circuit 60 that is to be electrically coupled to the inverting buffer 50 and is configured for generating at output an amplified voltage signal $V_{BOOST}$.

The superdiode 60 includes an input branch 60a and an output branch 60b. The input branch 60a comprises a supply transistor 62, having its source terminal S connected to the voltage $V_{DD}$, and its control (or gate) terminal G short-circuited with the drain terminal D. The input branch 60a further comprises an NMOS transistor 63 having its drain terminal D electrically coupled to the drain terminal D of the supply transistor 62, its source terminal S coupled to the reference terminal GND, and its control (or gate) terminal G that can be coupled to the output of the inverting buffer to receive the signal $V_{INV}$.

The output branch 60b comprises a supply transistor 64, having its source terminal S connected to the voltage $V_{DD}$, and its control (or gate) terminal G coupled to the control terminal G of the supply transistor 62. In other words, the supply transistors 62 and 64 are coupled together in current-mirror configuration. The output branch 60b further comprises an NMOS transistor 65 having its drain terminal D coupled to the drain terminal D of the supply transistor 64, its source terminal S coupled to the reference terminal GND, and its control terminal G connected to its own drain terminal D by means of a diode 66. In greater detail, the cathode C of the diode 66 is connected to the control terminal G of the NMOS transistor 65, and the anode A of the diode 66 is connected to the drain terminal D of the NMOS transistor 65. In addition, coupled between the control terminal G and the source terminal S of the NMOS transistor 65 is a capacitor 68, having a value of capacitance of one or more picofarads (for example, 1 pF). In any case, the value of capacitance of the capacitor 68 is chosen according to the requirement of persistence of the value of $V_{GS}$.

In use, the signal at output from the superdiode 60 charges the capacitor 68, thus increasing the voltage present on the output of the superdiode 60 itself. The diode 66 has the function of preventing a discharge of the capacitor 68 during negative half-waves of the signal at input from the superdiode 60. The superdiode 60 basically functions as a diode with zero voltage drop, ensuring that the output $V_{BOOST}$ "follows" the input $V_{INV}$ only when $V_{INV}$ increases. In other words, rising of the signal $V_{INV}$ controls rising of the signal $V_{BOOST}$, but falling of the signal $V_{INV}$ does not have a similar effect of control on falling of the signal $V_{BOOST}$.

Figure 13:
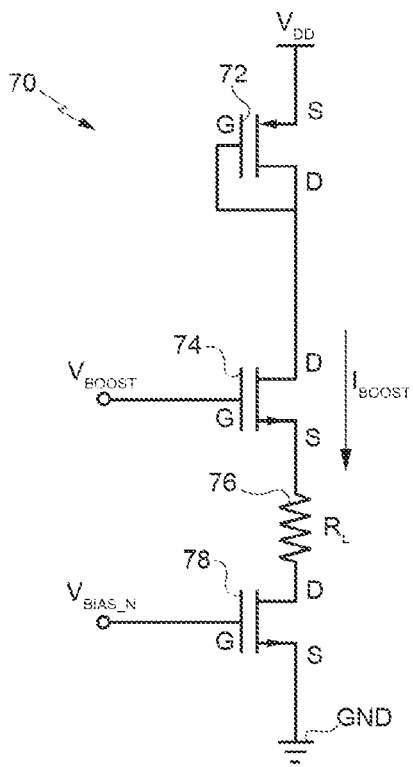
FIG. 13 shows a circuit implementation of a linearization and current-limiting block belonging to the adjustment circuit of FIG. 5.

FIG. 13 illustrates a block 70 for linear amplification of current, configured for receiving at input the amplified voltage signal $V_{BOOST}$ and for supplying at output the current signal $I_{BOOST}$, having a linear dependence upon the amplified voltage signal $V_{BOOST}$. For this purpose, the linear-current-amplification block 70 comprises a supply transistor 72, of a PMOS type, having its source terminal S biased at the voltage $V_{DD}$, and its control (or gate) terminal G connected to its drain terminal D so that the biasing signal of the control terminal G is the signal itself that flows in the linear-current-amplification block 70. Moreover, the linear-current-amplification block 70 comprises an NMOS transistor 74, having its drain terminal D coupled to the drain terminal D of the supply transistor 72, its control (or gate) terminal G coupled to the output of the superdiode 60 to receive the amplified voltage signal $V_{BOOST}$, and its source terminal S coupled to a conduction terminal of a resistor 76. The other conduction terminal of the resistor 76 is coupled to the reference terminal GND through a further NMOS transistor 78, controlled in the closed state (conduction) by means of an appropriate biasing signal applied to the control terminal G. The NMOS transistor 78 has the function of current limiter, and is configured for imposing a maximum value of the current signal $I_{BOOST}$ so as to not exceed a pre-defined consumption threshold. Said threshold depends upon the particular application, and may for example be chosen equal to 100 nA or some hundreds of nanoamps and, if need be, up to some microamps. The configuration of the NMOS transistor 78 in such a way that the latter will carry the maximum desired current is obtained by selecting in a way in itself known the shape factor W/L of said transistor.

The resistor 76 is a degeneration resistor, and has a value of resistance $R_L$ for example of approximately 100 kΩ, and has the function of linearizing the current signal $I_{BOOST}$. In fact, as is known, this configuration increases the output resistance and enables the aforementioned effect to be obtained.

It should be noted that, in a simplified embodiment of the linear-current-amplification block 70, only the NMOS transistor 74 and the resistor 76 are present, whereas the current-limiting transistor 78 may be omitted. The supply transistor 72, in transdiode configuration, has the function (as may be noted more clearly in FIGS. 14-16) of mirroring the current that flows in the linear-current-amplification block 70, but is not in itself necessary for operation of the linear-current-amplification block 70. Preferably, the transistor 72 is sized (by designing appropriately the shape factor W/L) in such a way that the current $I_{BOOST}$ is attenuated when it is mirrored and then re-injected into the input stage constituted by the supply transistors 30, 32, 34 and 51, as shown for example in FIG. 15.

Figure 1:
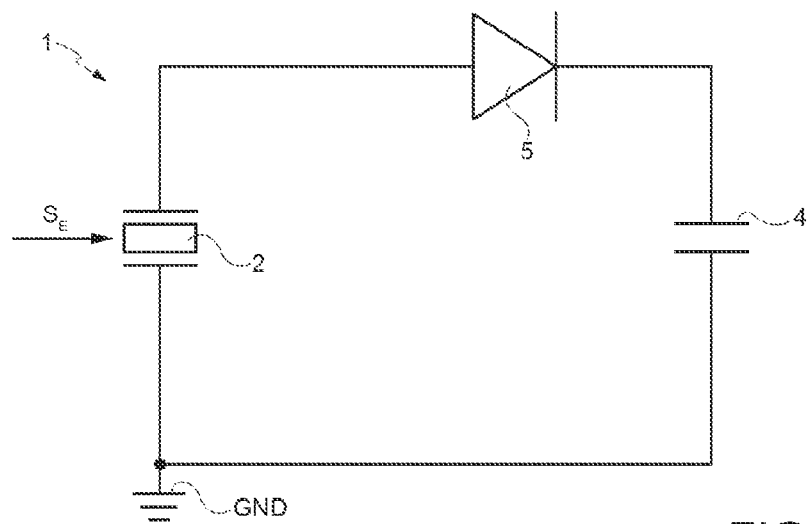
FIG. 1 shows an energy-scavenging system according to a known embodiment.
Figure 2A:
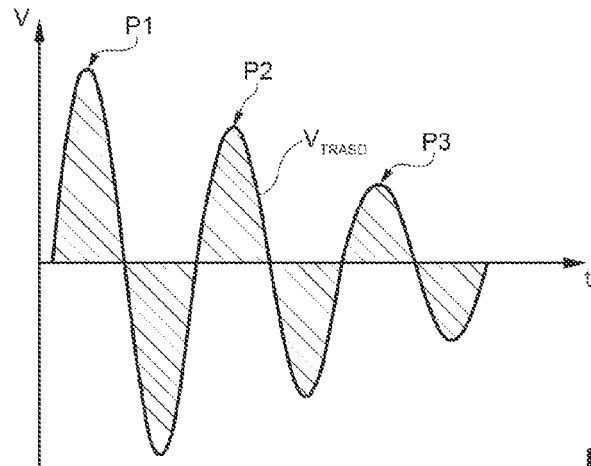
FIGS. 2a and 2b show, respectively, an electrical signal transduced by the environmental-energy-scavenging system of FIG. 1 and an electrical signal stored by the environmental-energy-scavenging system of FIG. 1.
Figure 2B:
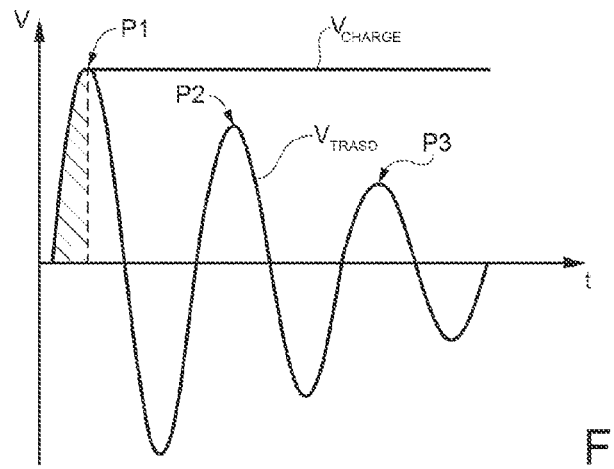
Figure 14:
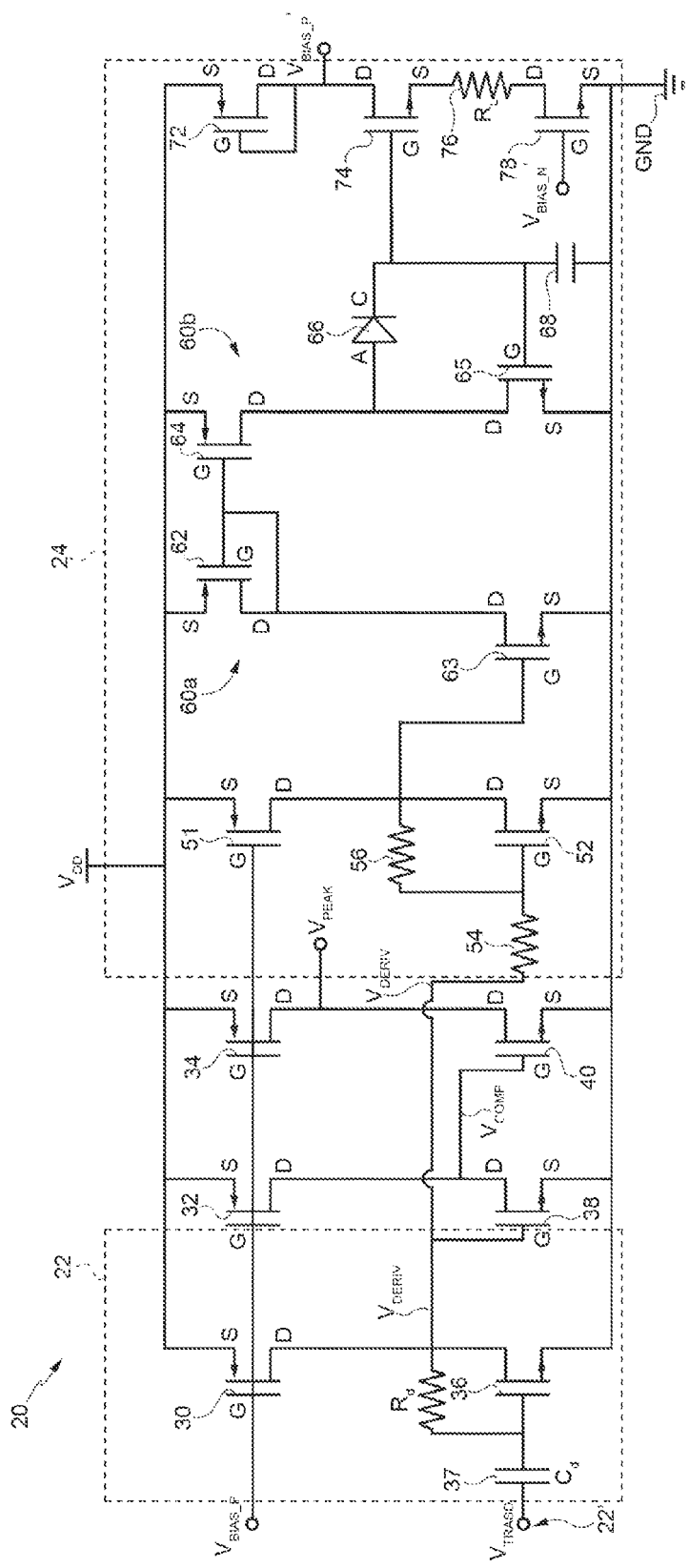
FIG. 14 shows a circuit implementation of the power-supply adjustment circuit.

FIG. 14 shows the adjustment circuit 20 of FIG. 1 according to one embodiment, in particular comprising the differentiator 22, the comparator 26, the peak detector 28, the inverting buffer 50, the superdiode 60 and the linear-current-amplification block 70, as has been described previously.

It should be noted that the functions of comparison and peak detection provided by the comparator 26 and by the peak detector 28 are useful in an environmental-energy-scavenging system, but are not necessary for the operations of adjustment of the power supply. Said blocks, in fact, may be external to the adjustment circuit 20 of FIG. 14 and not integrated therein. These considerations apply also with reference to the alternative embodiments of the adjustment circuit, as described hereinafter with reference to FIGS. 15-17.

Figure 15:
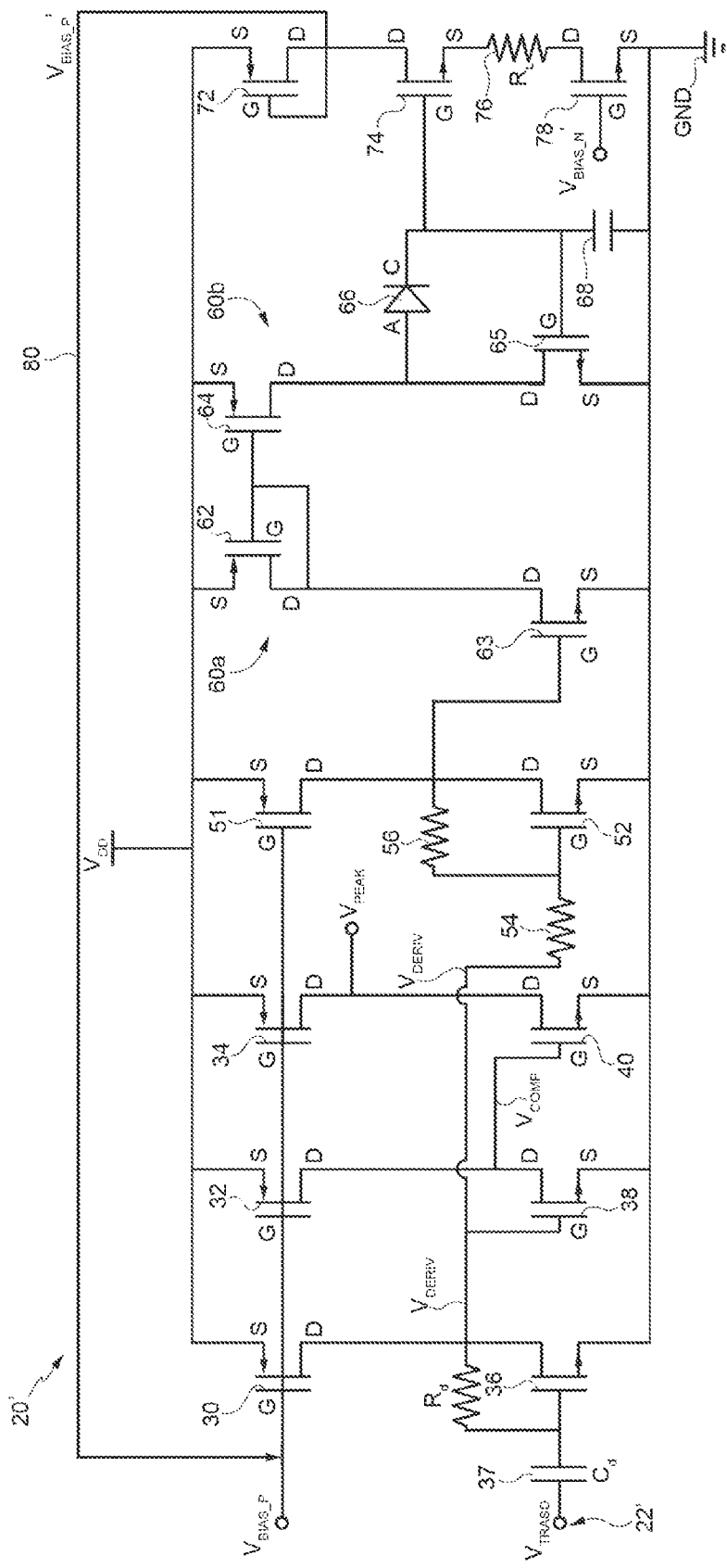
FIG. 15 shows a circuit implementation of the power-supply adjustment circuit.

FIG. 15 shows a further embodiment of the energy-scavenging circuit, here designated by the reference number 20'. The adjustment circuit 20' comprises, in addition to the elements already described with reference to the adjustment circuit 20, a feedback branch 80, configured to bias the control terminal G of the supply transistors 30, 32, 34 and 51, by means of the signal $V_{BIAS\_P}=V_{BIAS\_P}'$, at the signal $V_{BIAS\_P}'$ picked up on the drain terminal D of the transistor 74 of the linear-current-amplification block 70. Since the signal $V_{BIAS\_P}'$ picked up on the linear-current-amplification block 70 is a signal that depends upon the value of frequency of the transduced signal $V_{TRANSD}$ (on account of the fact that the amplified signal $V_{BOOST}$ controls the NMOS transistor 74) it follows that, at high frequencies of the transduced signal $V_{TRANSD}$, the differentiator 22, the comparator 26, the peak detector 28, and the inverting buffer 50 receive an amplified biasing current, which makes it possible to speed up the operations thereof, and react in a more effective way to input signals having marked variations and a high oscillating frequency.

Figure 16:
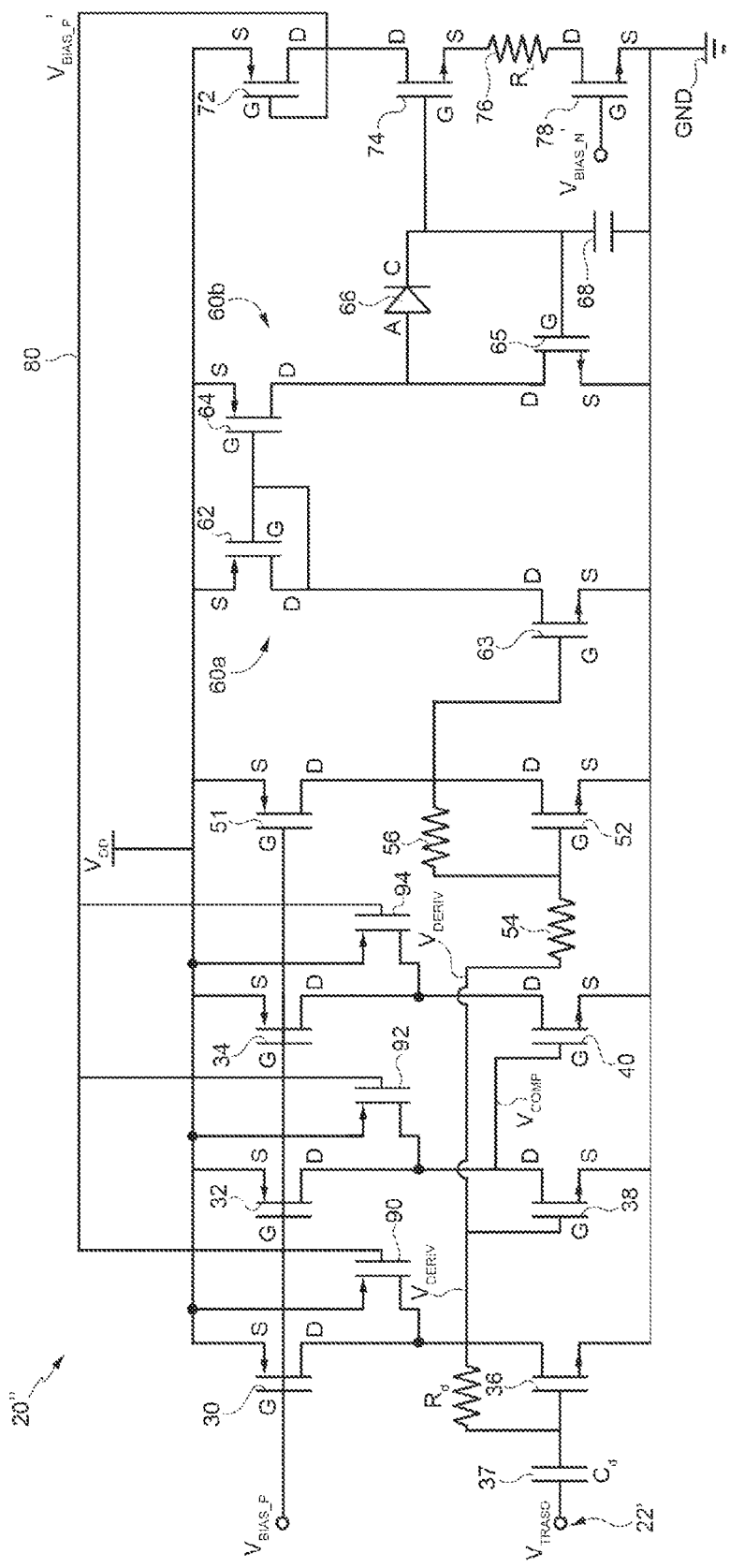
FIG. 16 shows a circuit implementation of the power-supply adjustment circuit.

FIG. 16 shows an adjustment circuit 20" according to a further embodiment. In a way similar to what has been described with reference to the adjustment circuit 20', also in this case the signal picked up on the drain terminal D of the transistor 74 of the linear-current-amplification block 70 is used for providing a current boost to the differentiator 22, to the comparator 26, to the peak detector 28, and to the inverting buffer 50. However, according to this embodiment, said signal does is not added to the biasing signal $V_{BIAS\_P}$, but is used for driving further supply transistors 90, 92, 94 and 96, independent of the supply transistors 30, 32, 34 and 51, which have their source terminal S coupled to $V_{DD}$, their drain terminal D coupled to the drain terminal D of the respective supply transistor 30, 32, 34, 51, and their control terminal G biased at $V_{BIAS\_P}'$. In this way, the currents of the supply transistors 30 and 90, the currents of the supply transistors 32 and 92, and the currents of the supply transistors 34 and 94 are added together, and hence the NMOS transistors 36, 38, 40, 52 are in turn biased by means of the respective addition current. The respective current signals that supply the differentiator 22, the comparator 26, the peak detector 28, and the inverting buffer 50 are, also in this case, current signals amplified with respect to the situation of FIG. 15 (absence of feedback).

Figure 17:
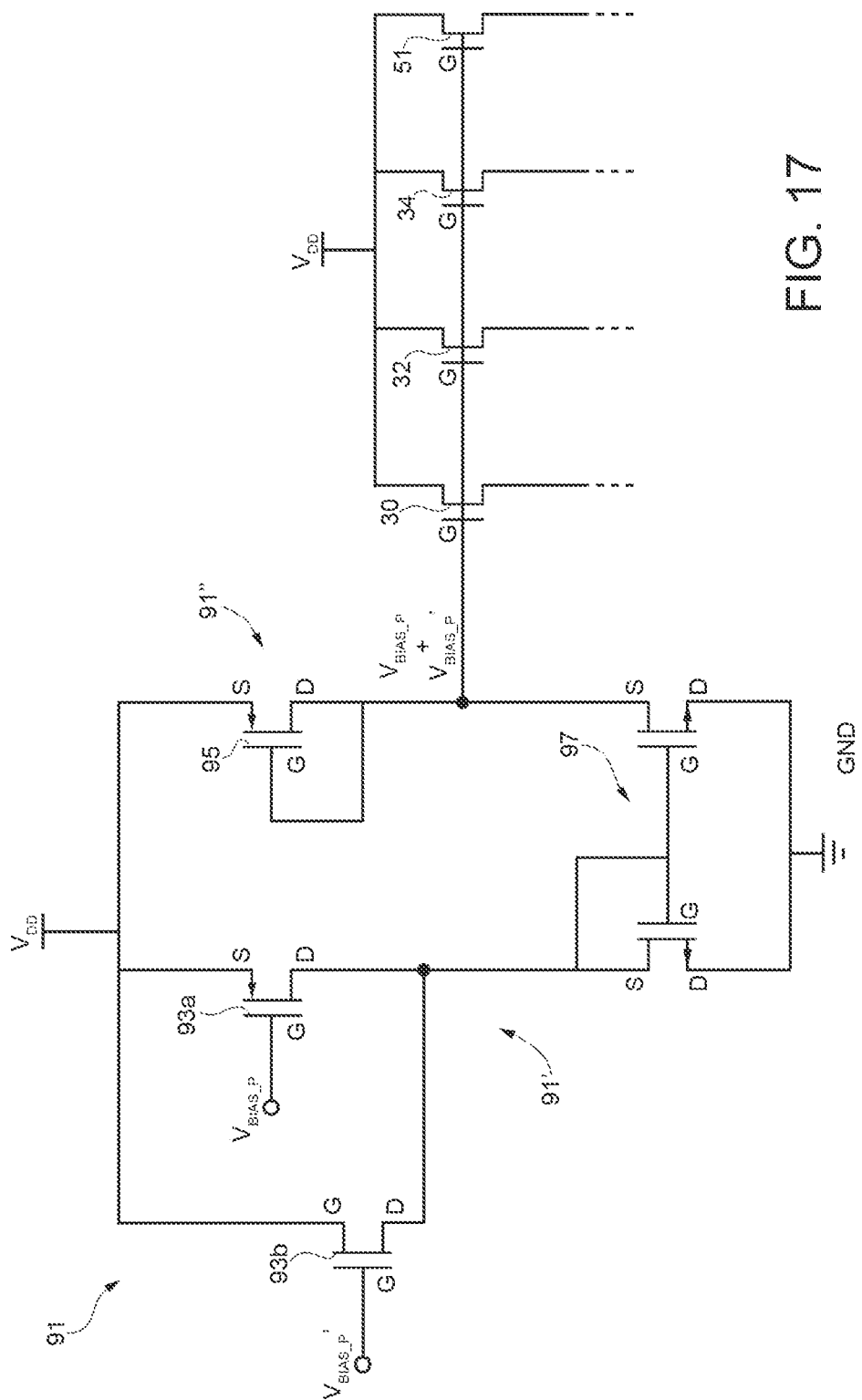
FIG. 17 shows a biasing circuit that can be coupled to the power-supply adjustment circuit of FIG. 14.

According to a further embodiment, the sum of $V_{BIAS\_P}$ and $V_{BIAS\_P}'$ is made by providing the adjustment circuit 20 with a biasing circuit 91, of the type shown in FIG. 17. The biasing circuit 91 comprises a first branch 91' including two supply transistors 93a and 93b (of a PMOS type) connected together in parallel (drain D and source S terminals coupled together), and the control terminals G of which are, in use, biased, respectively, at $V_{BIAS\_P}$ and $V_{BIAS\_P}'$. The biasing circuit 91 further comprises a second branch 91" including a supply transistor 95 (of a PMOS type) biased, in use, at a voltage equal to $V_{BIAS\_P}+V_{BIAS\_P}'$. For this purpose, the first and second branches 91', 91" are coupled together by means of a current mirror 97 so that in the second branch 91" there flows a current equal to the current that flows in the first branch 91'. The control terminal G and the drain terminal D of the supply transistor 95 are connected together so as to obtain the desired biasing for the supply transistor 95. The biasing signal for the supply transistors 30, 32, 34, 51 is supplied by the second branch 91", and is, as has been said, equal to $V_{BIAS\_P}+V_{BIAS\_P}'$.

From an examination of the characteristics of the circuit provided according to the present disclosure the advantages that it affords are evident.

In particular, sensing of the slope of the transduced signal supplies at the same time information on the presence of peaks so that the function of peak detection is integrated in the same circuit that supplies the biasing signal that varies according to the slope of the transduced signal.

Moreover, peak detection is independent of a minimum value of amplitude of the peaks.

Finally, the current boost can be applied selectively or simultaneously with any portion of the circuit, amongst which the comparator and the peak detectors.

Finally, it is clear that modifications and variations may be made to what has been described and illustrated herein, without thereby departing from the sphere of protection of the present invention, as defined in the annexed claims.

For example, the transducer 2 may be a cantilever piezoelectric transducer or of a bulk type, or else of a different type, for example electromagnetic.

Moreover, there may be present a plurality of transducers, each of which associated to a respective adjustment circuit 20, 20', or 20". Alternatively, a single respective adjustment circuit 20, 20', or 20" can receive at input a transduced signal generated by a plurality of transducers. In this case, the inductor is shared between the plurality of transducers.

Moreover, it is evident that, even though the description makes explicit reference to transistors of a MOS type (with N or P channel), the present invention may be easily modified for use in transistors of a type different from the one described, for example IGBTs.

What is claimed is:

1. A circuit, comprising:
    a differentiator configured to receive a first electrical signal which is a time-variable signal and supply a second electrical signal that is a time derivative of said first electrical signal;
    a transconductance amplifier configured to receive the second electrical signal and generate a third electrical signal that is a function of the second electrical signal and is amplified with respect to the second electrical signal;
    a power supply network for the differentiator and transconductance amplifier configured to supply respective power supply signals to the differentiator and transconductance amplifier; and
    a driving circuit of the power supply network, configured to drive the power supply signals in response to one or more biasing signals;
    said third electrical signal being, at least in part, supplied to said driving circuit for use in driving the power supply network so as to modulate an amplitude of at least one of the power supply signals.

2. A circuit, comprising:
    a differentiator configured to receive a first electrical signal which is a time-variable signal and supply a second electrical signal that is a time derivative of said first electrical signal; and
    a transconductance amplifier configured to receive the second electrical signal and generate a third electrical signal that is a function of the second electrical signal and is amplified with respect to the second electrical signal;
    wherein the transconductance amplifier includes:
        an amplification circuit configured to receive a signal that is a function of the second electrical signal and supply an amplified signal; and
        a linearization circuit configured to receive the amplified signal and generate the third electrical signal directly proportional to the amplified signal.

3. The circuit according to claim 2, further comprising:
    a power supply network for the differentiator and transconductance amplifier configured to supply respective power supply signals to the differentiator and transconductance amplifier; and
    a driving circuit of the power supply network, configured to drive the power supply signals in response to one or more biasing signals;
    said third electrical signal being, at least in part, supplied to said driving circuit for use in driving the power supply network so as to modulate an amplitude of at least one of the power supply signals.

4. The circuit according to claim 2, wherein the linearization circuit includes a common-source transistor with source degeneration, the amplified signal being supplied to a control terminal of the common-source transistor, and the third electrical signal being supplied to a drain terminal of the common-source transistor.

5. The adjustment circuit according to claim 1, further comprising an inverter coupled between the differentiator and the transconductance amplifier and configured to receive the second electrical signal and supply an inverted signal phase-shifted by $\pi/2$ with respect to the second electrical signal.

6. The circuit according to claim 1, wherein the power supply network comprises:
a first current generator configured to supply a first electric power supply signal to the differentiator on the basis of a first biasing signal; and
a second current generator configured to supply a second electric power supply signal to the transconductance amplifier on the basis of a second biasing signal, said third electrical signal being, at least in part, added to at least one of the first biasing signal and second biasing signal so as to increase an amplitude of the corresponding one of the first electric power supply signal and second electric power supply signal.

7. The circuit according to claim 1, wherein the power supply network comprises:
a first current generator configured to generate a first electric power supply signal for one of the differentiator and the transconductance amplifier on the basis of a first biasing signal; and
a second current generator configured to generate a second electric power supply signal for the other of the differentiator and transconductance amplifier on the basis of a second biasing signal,
wherein the first biasing signal is supplied by the driving circuit and the second biasing signal corresponds to the third electrical signal.

8. A method, comprising:
acquiring a first electrical signal which is a time-variable signal;
generating by a differentiator of a second electrical signal that is the time derivative of said first electrical signal;
generating by a transconductance amplifier of a third electrical signal that is a function of the second electrical signal and is amplified with respect to the second electrical signal;
supplying by a power supply network the differentiator and the transconductance amplifier with a respective power supply signal;
driving by a driving circuit of the supply network with one or more biasing signals so as to enable supply of the power supply signals to the differentiator and to the transconductance amplifier;
supplying, at least in part, said third electrical signal to said driving circuit; and
using by the driving circuit of the third electrical signal for driving the power supply network so as to modulate the amplitude of at least one of the power supply signals.

9. The method according to claim 8, wherein generating the third electrical signal comprises:
acquiring a signal that is a function of the second electrical signal;
amplifying said signal that is a function of the second electrical signal to generate an amplified signal; and
generating the third electrical signal directly proportional to the amplified signal.

10. The method according to claim 9, further comprising:
acquiring by an inverter the second electrical signal; and
phase shifting by π/2 the second electrical signal to generate an inverted signal.

11. The method according to claim 8, wherein supplying by the power supply network comprises:
generating a first biasing signal;
controlling by means of the first biasing signal a first current generator so as to generate a first electric power supply signal for the differentiator;
generating a second biasing signal;
controlling by means of the second biasing signal a second current generator so as to generate a second electric power supply signal for the transconductance amplifier; and
adding, at least in part, said third electrical signal to the first and/or to the second biasing signal for controlling the first and second current generators so as to increase the amplitude of the first electric power supply signal and the second electric power supply signal.

12. The method according to claim 8, wherein supplying by the power supply generator comprises:
generating a first biasing signal by means of said driving circuit;
controlling by means of the first biasing signal a first current generator to generate a first electric power supply signal for one of the differentiator and transconductance amplifier; and
controlling by means of the third biasing signal a second current generator so as to generate a second electric power supply signal for the other of the differentiator (22) and the transconductance amplifier.

13. A circuit, comprising:
a peak detection circuit configured to detect a peak voltage of a received time-varying voltage signal, said peak detection circuit comprising:
a differentiator circuit coupled to receive the time-varying voltage signal and generate a derivative voltage signal;
a biasing circuit configured to bias operation of the differentiator circuit with a bias supply, said differentiator circuit having a speed of operation dependent on said bias supply;
a transconductance circuit configured to process the derivative voltage signal and generate a bias control signal that is dependent on the derivative voltage signal, wherein the transconductance circuit comprises a peak detector circuit configured to detect a peak in said derivative voltage signal, said bias control signal applied to the biasing circuit to control the bias supply; and
said biasing circuit further configured to bias operation of the peak detector circuit with the bias supply, said peak detector circuit having a speed of operation dependent on said bias supply.

14. A circuit, comprising: a peak detection circuit configured to detect a peak voltage of a received time-varying voltage signal, said peak detection circuit comprising:
a differentiator circuit coupled to receive the time-varying voltage signal and generate a derivative voltage signal;
a biasing circuit configured to bias operation of the differentiator circuit with a bias supply, said differentiator circuit having a speed of operation dependent on said bias supply; and
a transconductance circuit configured to process the derivative voltage signal and generate a bias control signal that is dependent on the derivative voltage signal, said bias control signal applied to the biasing circuit to control the bias supply;
wherein the transconductance circuit comprises an inverting buffer circuit configured to invert said derivative voltage signal, said biasing circuit configured to bias operation of the inverting buffer circuit with the bias supply, said inverting buffer circuit having a speed of operation dependent on said bias supply.

15. The circuit of claim 14, wherein the transconductance circuit comprises a peak detector circuit configured to detect a peak in said derivative voltage signal, said biasing circuit configured to bias operation of the peak detector circuit with the bias supply, said peak detector circuit having a speed of operation dependent on said bias supply.

16. The circuit of claim 15, wherein said peak detector circuit comprises: a comparator circuit configured to compare said derivative voltage signal to a threshold.

17. The circuit of claim 14, wherein the transconductance circuit further comprises a boost circuit configured to generate an amplified voltage signal in response to the inverted derivative voltage signal.

18. The circuit of claim 17, wherein the transconductance circuit further comprises a current amplification circuit configured to convert the amplified voltage signal to a current boost signal, said bias control signal being derived from the current boost signal.

19. The circuit of claim 13, wherein said biasing circuit comprises a bias transistor having a source-drain path coupled to the differentiator circuit and a control terminal configured to receive said bias control signal.

* * * * *

UNITED STATES PATENT AND TRADEMARK OFFICE
CERTIFICATE OF CORRECTION

| | | |
|---|---|---|
| PATENT NO. | : 9,209,763 B2 | Page 1 of 1 |
| APPLICATION NO. | : 14/052495 | |
| DATED | : December 8, 2015 | |
| INVENTOR(S) | : Bottarel et al. | |

It is certified that error appears in the above-identified patent and that said Letters Patent is hereby corrected as shown below:

In the Claims:

Column 14, claim 12, line 22, delete "(22)".

Signed and Sealed this
Twenty-ninth Day of March, 2016

Michelle K. Lee
*Director of the United States Patent and Trademark Office*